United States Patent
Tseng et al.

(10) Patent No.: US 10,029,910 B1
(45) Date of Patent: Jul. 24, 2018

(54) FORMATION METHOD OF MEMS DEVICE STRUCTURE WITH CAVITIES

(71) Applicant: Taiwan Semiconductor Manufacturing Co., Ltd., Hsinchu (TW)

(72) Inventors: Lee-Chuan Tseng, New Taipei (TW); Chang-Ming Wu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/447,711

(22) Filed: Mar. 2, 2017

(51) Int. Cl.
*B81C 1/00* (2006.01)
*B81B 7/00* (2006.01)

(52) U.S. Cl.
CPC ........ *B81B 7/0038* (2013.01); *B81C 1/00285* (2013.01); *B81B 2201/0235* (2013.01); *B81B 2201/0242* (2013.01)

(58) Field of Classification Search
CPC ............................ B81C 1/00285; B81B 7/0038
See application file for complete search history.

(56) References Cited

U.S. PATENT DOCUMENTS

| | | | |
|---|---|---|---|
| 8,987,059 B2 | 3/2015 | Liang et al. | |
| 9,040,334 B2 | 5/2015 | Chu et al. | |
| 9,065,358 B2 | 6/2015 | Tsai et al. | |
| 9,085,455 B2 | 7/2015 | Cheng et al. | |
| 9,085,456 B2 | 7/2015 | Tsai et al. | |
| 9,122,827 B2 | 9/2015 | Chen et al. | |
| 9,133,017 B2 | 9/2015 | Liang et al. | |
| 9,138,994 B2 | 9/2015 | Peng et al. | |
| 9,139,420 B2 | 9/2015 | Chang et al. | |
| 9,139,423 B2 | 9/2015 | Chien et al. | |
| 9,181,083 B2 | 11/2015 | Tsai et al. | |
| 9,187,317 B2 | 11/2015 | Cheng et al. | |
| 9,233,839 B2 | 1/2016 | Liu et al. | |
| 9,236,877 B2 | 1/2016 | Peng et al. | |
| 9,238,581 B2 | 1/2016 | Wu et al. | |
| 9,416,003 B2 * | 8/2016 | Lagouge | B81C 1/00285 |
| 2014/0287548 A1 | 9/2014 | Lin et al. | |
| 2015/0137303 A1 | 5/2015 | Chou et al. | |
| 2015/0175405 A1 | 6/2015 | Cheng | |
| 2015/0175407 A1 | 6/2015 | Cheng et al. | |
| 2015/0196912 A1 | 7/2015 | Tsai et al. | |

* cited by examiner

*Primary Examiner* — Mark Prenty
(74) *Attorney, Agent, or Firm* — McClure, Qualey & Rodack, LLP

(57) ABSTRACT

Structures and formation methods of a MEMS device structure are provided. The MEMS device structure includes a semiconductor substrate having a first region and a second region, and a MEMS layer over the semiconductor substrate. The MEMS layer has a first through hole positioned in the first region and a second through hole positioned in the second region. The MEMS device structure also includes a cap layer over the MEMS layer, a first cavity between the semiconductor substrate and the cap layer and in the first region, and a second cavity between the semiconductor substrate and the cap layer and in the second region. The MEMS device structure further includes a carbon-based degradation product in the first cavity.

20 Claims, 8 Drawing Sheets

FORMATION METHOD OF MEMS DEVICE STRUCTURE WITH CAVITIES

BACKGROUND

Advancements in micro-machining and other micro-fabrication techniques and processes have enabled manufacture of a wide variety of micro-electronic and micro-electromechanical systems (MEMS) devices. Different MEMS devices are designed and fabricated to operate in different environments. For example, some types of MEMS devices are designed to operate in a vacuum while other MEMS devices are designed to operate within a pressurized environment.

MEMS devices are widely used in applications such as automotive systems, inertial guidance systems, household appliances, game devices, protection systems for a variety of devices, and many other industrial, scientific, and engineering systems.

However, existing MEMS devices have not been satisfactory in every respect. Therefore, it is a challenge to form a reliable MEMS device structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
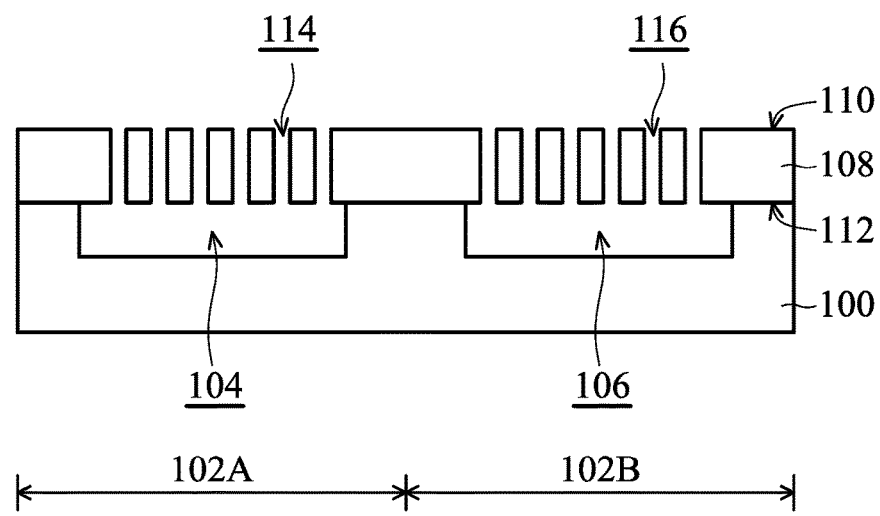
FIGS. 1A-1E are cross-sectional views of various stages of a process for forming a MEMS device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the MEMS device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a MEMS device structure, in accordance with some embodiments. As shown in FIG. 1A, a semiconductor substrate 100 is received or provided, in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 100 is an un-doped substrate. However, in some other embodiments, the semiconductor substrate 100 is a doped substrate such as a P-type substrate or an N-type substrate.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other applicable processes.

The device elements are interconnected through an interconnection structure of the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof. In some embodiments, the semiconductor substrate 100 has various circuitry fabricated thereon or therein. In some embodiments, the semiconductor substrate 100 is a Complementary Metal-Oxide Semiconductor (CMOS) substrate.

As shown in FIG. 1A, the semiconductor substrate 100 has a first region 102A and a second region 102B, in accordance with some embodiments. As shown in FIG. 1A, the semiconductor substrate 100 has a first recess 104 in the first region 102A and a second recess 106 in the second region 102B, in accordance with some embodiments.

As shown in FIG. 1A, a MEMS layer (Micro-Electro-Mechanical System layer) 108 is provided, in accordance with some embodiments. As shown in FIG. 1A, the MEMS layer 108 has a top surface 110 and a bottom surface 112 opposite to each other, in accordance with some embodiments.

In some embodiments, the MEMS layer 108 is made of a semiconductor material including silicon or another elementary semiconductor material such as germanium. In some other embodiments, the MEMS layer 108 is made of another suitable material.

As shown in FIG. 1A, the semiconductor substrate 100 is bonded to the bottom surface 112 of the MEMS layer 108 with the first recess 104 and the second recess 106 facing the bottom surface 112, in accordance with some embodiments. In some embodiments, the bonding process includes eutectic bonding, thermo-compression bonding, fusion bonding, another applicable bonding process, or a combination thereof.

As shown in FIG. 1A, one (or more) first through hole 114 and one (or more) second through hole 116 are formed in the MEMS layer 108, in accordance with some embodiments. In some embodiments, the first through hole 114 and the second through hole 116 are formed by using a photolithography process and an etching process. As shown in FIG. 1A, the first through hole 114 extends from the top surface 110 to the bottom surface 112 of the MEMS layer 108, in accordance with some embodiments. As shown in FIG. 1A, the second through hole 116 extends from the top surface 110 to the bottom surface 112 of the MEMS layer 108, in accordance with some embodiments.

As shown in FIG. 1A, after bonding the semiconductor substrate 100 to the MEMS layer 108, the first through hole 114 is positioned in the first region 102A, and the second through hole 116 is positioned in the second region 102B, in accordance with some embodiments.

Figure 1B:
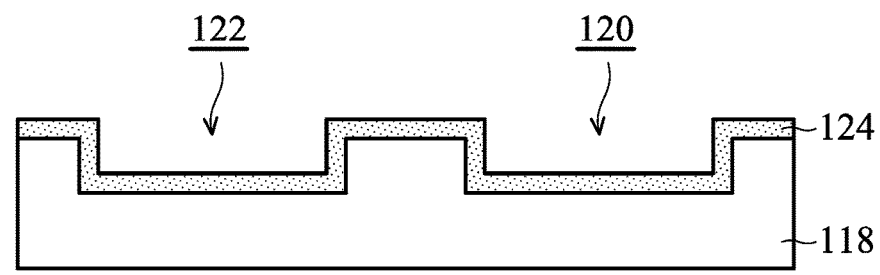

As shown in FIG. 1B, a cap layer 118 is provided, in accordance with some embodiments. As shown in FIG. 1B, the cap layer 118 has a third recess 120 and a fourth recess 122, in accordance with some embodiments.

In some embodiments, the cap layer 118 is made of a semiconductor material including silicon or another elementary semiconductor material such as germanium. In some other embodiments, the cap layer 118 is made of another suitable material.

As shown in FIG. 1B, a polymer material layer 124 is conformally deposited over the cap layer 118, in accordance with some embodiments. In some embodiments, the polymer material layer 124 is made of a thermal sensitive polymer, a photoactive polymer, photoresist, another suitable material, or a combination thereof. In some embodiments, the thermal sensitive polymer includes fluoroelastomer, acrylonitrile butadiene rubber, polychloroprene, butyl rubber, polyurethane, silicone, perfluoroelastomer, polytetrafluoroethylene, polychlorotrifluoroethylene, polyimide, another suitable material, or a combination thereof.

Figure 1C:
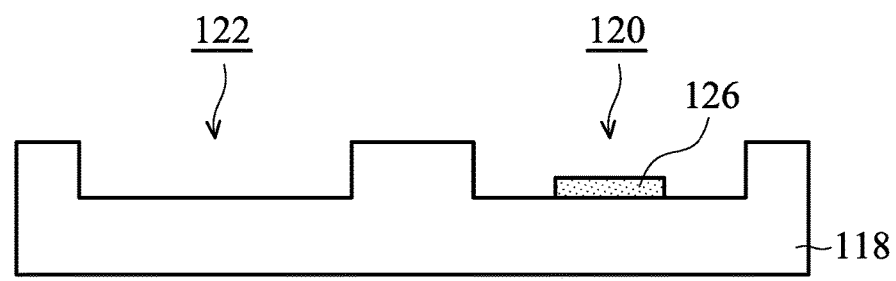

Afterwards, as shown in FIG. 1C, the polymer material layer 124 is patterned to form the polymer element 126 in the third recess 120, in accordance with some embodiments. In some embodiments, the polymer element 126 is made of a thermal sensitive polymer, a photoactive polymer, photoresist, another suitable material, or a combination thereof. In some embodiments, the thermal sensitive polymer includes fluoroelastomer, acrylonitrile butadiene rubber, polychloroprene, butyl rubber, polyurethane, silicone, perfluoroelastomer, polytetrafluoroethylene, polychlorotrifluoroethylene, polyimide, another suitable material, or a combination thereof.

In some embodiments, the polymer material layer 124 is made of a thermal sensitive polymer or a photoactive polymer, and is patterned by using a photolithography process and an etching process. However, in some other embodiments of the present disclosure, the polymer material layer 124 is made of photoresist, and is patterned by using an exposure process and a development process. However, the embodiments of the present disclosure are not limited thereto. The polymer material layer 124 may be patterned by any other applicable process.

Figure 1D:
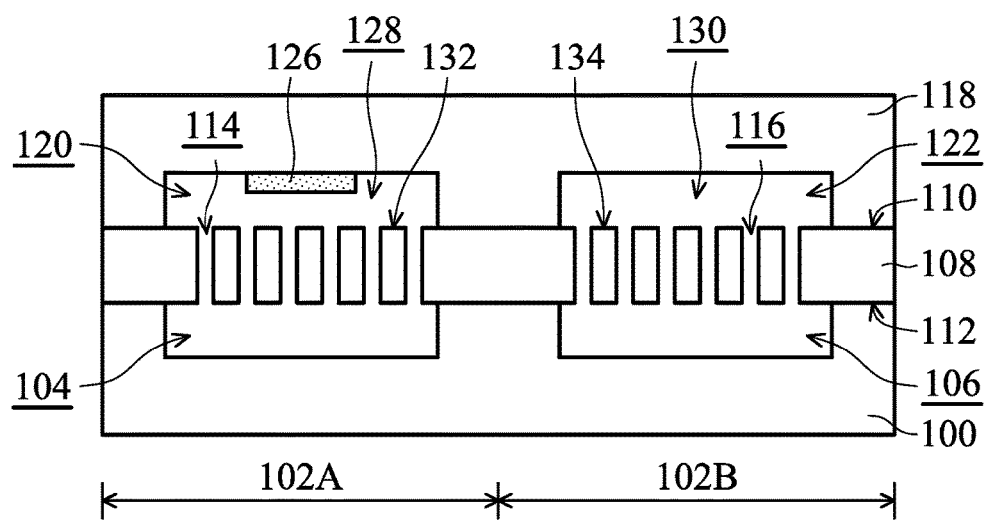

As shown in FIG. 1D, the cap layer 118 is bonded to the top surface 110 of the MEMS layer 108 with the third recess 120 and the fourth recess 122 facing the top surface 110, in accordance with some embodiments. In some embodiments, the bonding process includes eutectic bonding, thermo-compression bonding, fusion bonding, another applicable bonding process, or a combination thereof.

As shown in FIG. 1D, after bonding the semiconductor substrate 100 and the cap layer 118 to the MEMS layer 108, the third recess 120 is positioned in the first region 102A and aligned with the first recess 104, in accordance with some embodiments. As shown in FIG. 1D, the first recess 104 and the third recess 120 are connected by the first through hole 114 and form a first cavity 128, in accordance with some embodiments. As shown in FIG. 1D, the polymer element 126 is positioned in the third recess 120 of the first cavity 128, in accordance with some embodiments.

As shown in FIG. 1D, after bonding the semiconductor substrate 100 and the cap layer 118 to the MEMS layer 108, the fourth recess 122 is positioned in the second region 102B and aligned with the second recess 106, in accordance with some embodiments. As shown in FIG. 1D, the second recess 106 and the fourth recess 122 are connected by the second through hole 116 and form a second cavity 130, in accordance with some embodiments.

As shown in FIG. 1D, after bonding the semiconductor substrate 100 and the cap layer 118 to the MEMS layer 108, the MEMS layer 108 over the semiconductor substrate 100, and the cap layer 118 over the MEMS layer 108, in accordance with some embodiments.

As shown in FIG. 1D, after bonding the semiconductor substrate 100 and the cap layer 118 to the MEMS layer 108, the first cavity 128 is between the semiconductor substrate 100 and the cap layer 118 and in the first region 102A, and the second cavity 130 is between the semiconductor substrate 100 and the cap layer 118 and in the second region 102B, in accordance with some embodiments.

As shown in FIG. 1D, the first cavity 128 and the second cavity 130 are isolated from each other, in accordance with some embodiments. As shown in FIG. 1D, the first cavity 128 is a hermetically sealed cavity, in accordance with some embodiments. As shown in FIG. 1D, the second cavity 130 is a hermetically sealed cavity, in accordance with some embodiments.

In some embodiments, the bonding process which bonds the cap layer 118 to the MEMS layer 108 is performed under substantially a vacuum environment. In some embodiments, the first cavity 128 has a first pressure, and the second cavity 130 has a second pressure. In some embodiments, after the bonding process which bonds the cap layer 118 to the MEMS layer 108, and before the subsequent degradation process, the first pressure and the second pressure are both at a first pressure level. In some embodiments, the first pressure level is substantially a vacuum.

As shown in FIG. 1D, a first MEMS device 132 is formed in the first cavity 128, in accordance with some embodiments. As shown in FIG. 1D, a second MEMS device 134 is formed in the second cavity 130, in accordance with some embodiments. In some embodiments, the first MEMS device 132 is an accelerometer, and the second MEMS device 134 is a gyroscope. However, the embodiments of the present disclosure are not limited thereto. The first MEMS device 132 and the second MEMS device 134 may be any other suitable MEMS device.

Figure 1E:
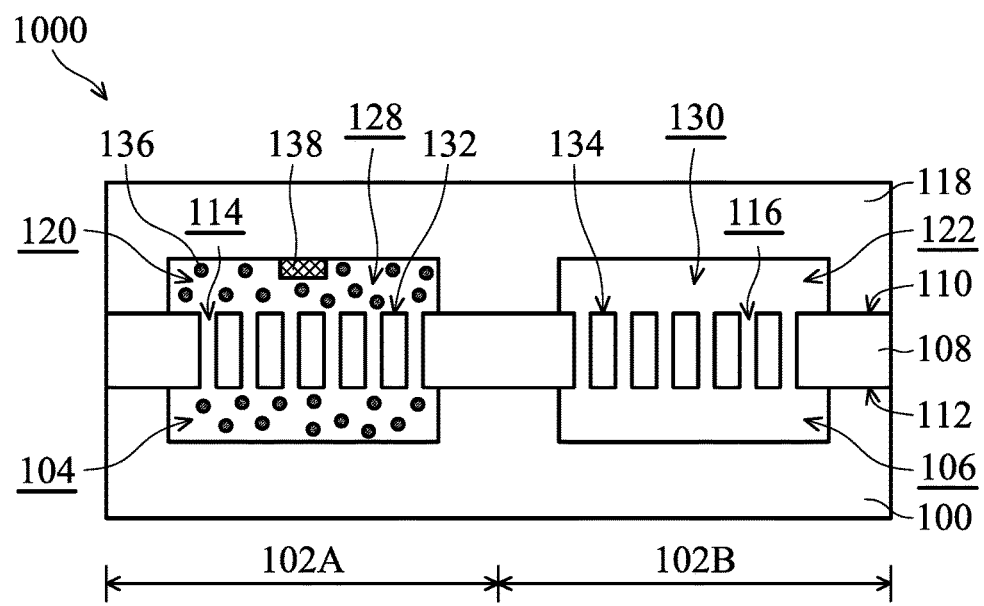

Afterwards, as shown in FIG. 1E, the polymer element 126 is degraded to form a gas 136 in the first cavity 128 and form a MEMS device structure 1000, in accordance with some embodiments. In some embodiments, due to the gas 136 formed in the first cavity 128, the first pressure of the first cavity 128 is increased from the first pressure level to a second pressure level, in accordance with some embodiments. In some embodiments, the second pressure level is higher than the first pressure level.

In some embodiments, the degradation of the polymer element 126 is achieved by heating the polymer element 126. In some other embodiments, the degradation of the polymer element 126 is achieved by exposing the polymer element 126 to light.

In some embodiments, the degradation of the polymer element 126 is performed after the bonding process which bonds the cap layer 118 to the MEMS layer 108. In some embodiments, the degradation of the polymer element 126 is achieved by heating the polymer element 126. In some embodiments, the heating temperature in the degradation process is higher than the bonding temperature in the bonding process.

However, the embodiments of the present disclosure are not limited thereto. In some other embodiments, the degradation of the polymer element 126 is performed during the bonding process which bonds the cap layer 118 to the MEMS layer 108.

In some embodiments, during the degradation of the polymer element 126, the second pressure of the second cavity 130 remains constant. In other words, in some embodiments, after the degradation process, the second pressure of the second cavity 130 is kept at the first pressure level. In some embodiments, after the degradation process, the first pressure of the first cavity 128 is higher than the second pressure of the second cavity 130.

In some embodiments, the first pressure of the first cavity 128 is in a range from about 30 torr to about 1000 torr, for example, from about 100 torr to about 760 torr. In some embodiments, the second pressure of the second cavity 130 is substantially a vacuum.

It should be noted that, if the first pressure of the first cavity 128 is lower than about 30 torr, the first pressure of the first cavity 128 may be too low, and the MEMS device structure might be negatively affected. However, if the first pressure of the first cavity 128 is higher than about 1000 torr, the MEMS device structure might be negatively affected too.

In some cases, materials other than polymer are used to form the gas in the first cavity. For example, a high density plasma oxide is used to form the gas in the first cavity. However, in these cases, the material other than polymer cannot produce sufficient gas, and the first pressure of the first cavity cannot reach a high pressure level. In some other cases, a method using a seal film is used to increases the first pressure of the first cavity. However, this method requires high cost.

In some embodiments, the polymer can produce sufficient gas in the first cavity. Therefore, the first pressure of the first cavity in some embodiments can reach the high pressure level.

In some embodiments, the polymer material layer is easy to pattern. Therefore, the method in some embodiments is cost-effective.

In some embodiments, the amount of gas produced is easy to control by controlling the heating temperature, heating time in the degradation process, exposure intensity, exposure time in the degradation process, the amount of polymer element, or the material of the polymer element. Therefore, in some embodiments, the first pressure of the first cavity can be accurately controlled, and the yield can be improved.

In some embodiments, the gas 136 in the first cavity 128 includes gaseous dihydrogen monoxide, gaseous carbon monoxide, gaseous carbon dioxide, gaseous hydrocarbon, and a first organic gas containing carbon, hydrogen and oxygen. In some embodiments, the first organic gas is represented by $C_m H_q O_r$. In some embodiments, m is an integer in a range from 1 to 30, for example from 2 to 15, q is an integer in a range from 4 to 62, for example from 6 to 32, and r is an integer in a range from 1 to 62, for example from 6 to 32.

In some embodiments, the gas 136 in the first cavity 128 further includes a second organic gas containing carbon, hydrogen and nitrogen. In some embodiments, the second organic gas is represented by $C_a H_b N_d$. In some embodiments, a is an integer in a range from 1 to 30, for example from 2 to 15, b is an integer in a range from 5 to 124, for example from 7 to 62, and d is an integer in a range from 1 to 62, for example from 2 to 30.

In some embodiments, the gas 136 in the first cavity 128 further includes a third organic gas containing carbon, hydrogen and halogen. In some embodiments, the third organic gas is represented by $C_e H_f X_g$. In some embodiments, e is an integer in a range from 1 to 30, for example from 2 to 15, f is an integer in a range from 1 to 61, for example from 5 to 30, and g is an integer in a range from 61 to 1, for example from 30 to 5. In some embodiments, X is halogen. In some embodiments, the halogen includes fluorine (F), chlorine (Cl), bromine (Br), iodine (I), and astatine (At).

In some embodiments, the gas 136 in the first cavity 128 further includes a fourth organic gas containing carbon and halogen. In some embodiments, the fourth organic gas is represented by $C_iX_j$. In some embodiments, i is an integer in a range from 1 to 30, for example from 2 to 15, j is an integer in a range from 4 to 62, for example from 6 to 32.

The embodiments of the present disclosure are not limited thereto. In some embodiments, the gas 136 includes any organic gas containing one or more elements including carbon, hydrogen, oxygen, nitrogen, halogen, sulfur and/or silicon.

As shown in FIG. 1E, the degradation process of the polymer element 126 also forms a degradation product 138 in the first cavity 128, in accordance with some embodiments. In some embodiments, the degradation product 138 is a carbon-based degradation product.

In some embodiments, the degradation product 138 includes a solid degradation product including coke, pure carbon, ash, any other degradation product, or a combination thereof. In some embodiments, the coke is mainly made of carbon and includes hydrogen, oxygen, nitrogen and/or sulfur.

In some embodiments, the degradation product 138 includes a liquid degradation product. In some embodiments, the liquid degradation product includes tar, acetone, acetic acid, oleic acid, another suitable material, or a combination thereof.

It should be noted that the exemplary embodiment set forth in FIGS. 1A-1E is merely for the purpose of illustration. In addition to the embodiment set forth in FIGS. 1A-1E, the MEMS device structure can be manufactured by another applicable process as shown in FIGS. 2A-2E. This will be described in more detail in the following description. Therefore, the present disclosure is not limited to the exemplary embodiment shown in FIGS. 1A-1E.

FIGS. 2A-2E are cross-sectional views of various stages of a process for forming a MEMS device structure, in accordance with some embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

Figure 2A:
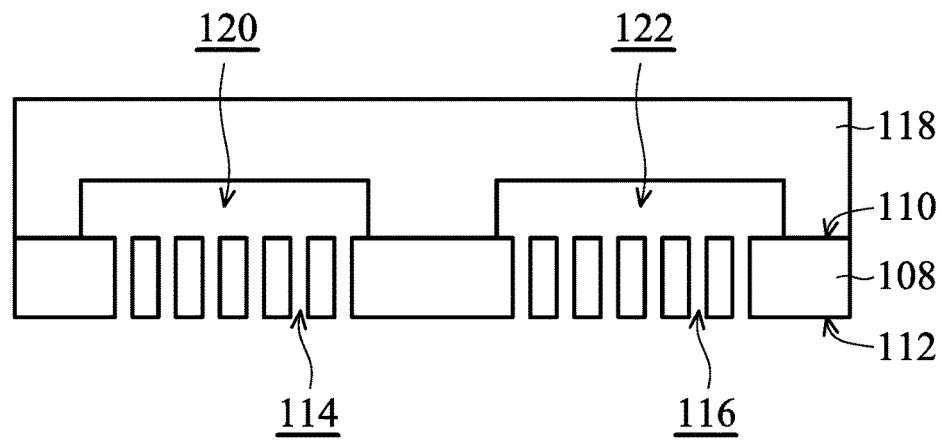
FIGS. 2A-2E are cross-sectional views of various stages of a process for forming a MEMS device structure, in accordance with some embodiments.

As shown in FIG. 2A, a MEMS layer (Micro-Electro-Mechanical System layer) 108 and a cap layer 118 are provided, in accordance with some embodiments. As shown in FIG. 2A, the cap layer 118 has a third recess 120 and a fourth recess 122, in accordance with some embodiments.

As shown in FIG. 2A, the cap layer 118 is bonded to the top surface 110 of the MEMS layer 108 with the third recess 120 and the fourth recess 122 facing the top surface 110, in accordance with some embodiments.

Figure 2B:
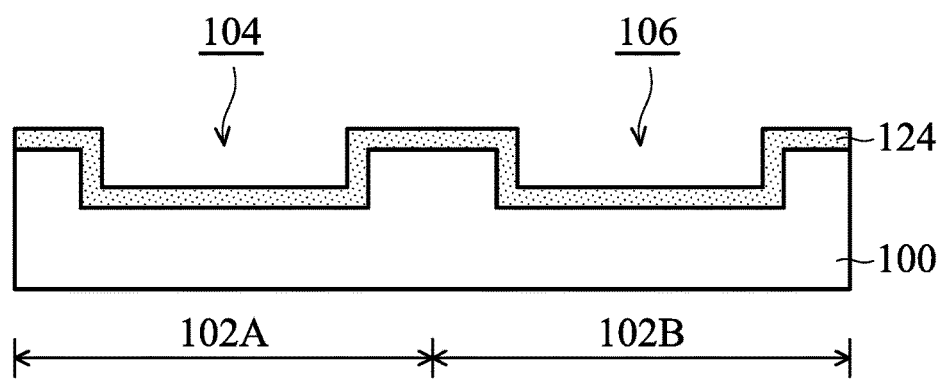

As shown in FIG. 2B, a semiconductor substrate 100 is received or provided, in accordance with some embodiments. In some embodiments, the semiconductor substrate 100 is a Complementary Metal-Oxide Semiconductor (CMOS) layer. As shown in FIG. 2B, the semiconductor substrate 100 has a first recess 104 in the first region 102A and a second recess 106 in the second region 102B, in accordance with some embodiments.

As shown in FIG. 2B, a polymer material layer 124 is conformally deposited over the semiconductor substrate 100, in accordance with some embodiments. In some embodiments, the polymer material layer 124 is made of a thermal sensitive polymer, a photoactive polymer, photoresist, another suitable material, or a combination thereof. In some embodiments, the thermal sensitive polymer includes fluoroelastomer, acrylonitrile butadiene rubber, polychloroprene, butyl rubber, polyurethane, silicone, perfluoroelastomer, polytetrafluoroethylene, polychlorotrifluoroethylene, polyimide, another suitable material, or a combination thereof.

Figure 2C:
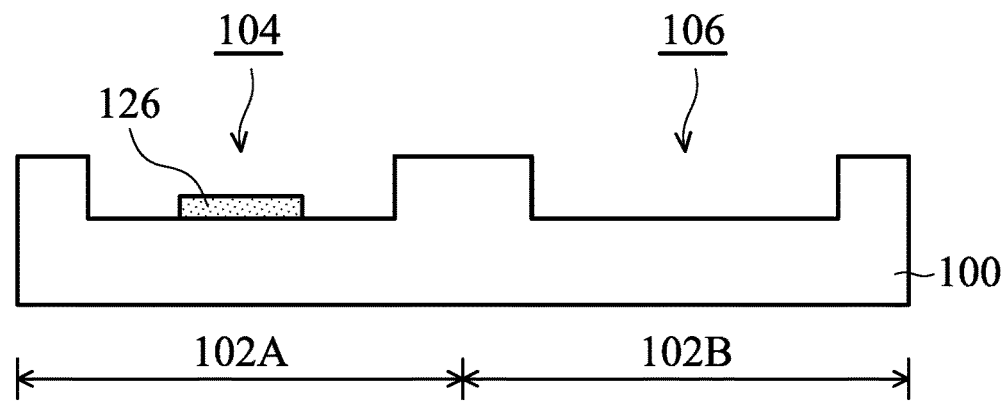

Afterwards, as shown in FIG. 2C, the polymer material layer 124 is patterned to form the polymer element 126 in the first recess 104, in accordance with some embodiments. In some embodiments, the polymer element 126 is made of a thermal sensitive polymer, a photoactive polymer, photoresist, another suitable material, or a combination thereof. In some embodiments, the thermal sensitive polymer includes fluoroelastomer, acrylonitrile butadiene rubber, polychloroprene, butyl rubber, polyurethane, silicone, perfluoroelastomer, polytetrafluoroethylene, polychlorotrifluoroethylene, polyimide, another suitable material, or a combination thereof.

Figure 2D:
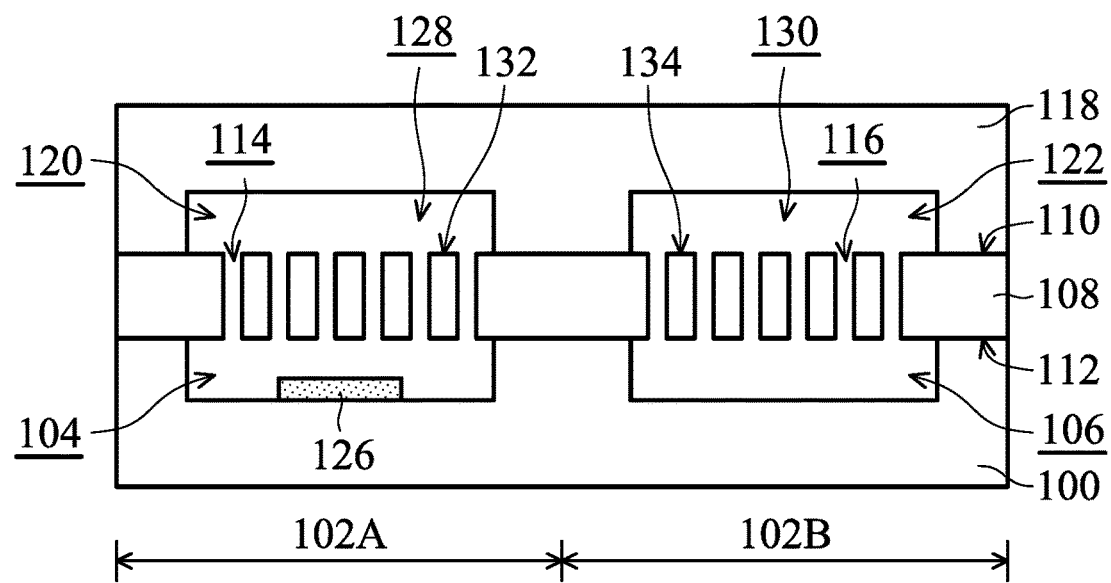

Afterwards, as shown in FIG. 2D, the semiconductor substrate 100 is bonded to the bottom surface 112 of the MEMS layer 108 with the first recess 104 and the second recess 106 facing the bottom surface 112, in accordance with some embodiments. In some embodiments, the bonding process includes eutectic bonding, thermo-compression bonding, fusion bonding, another applicable bonding process, or a combination thereof.

As shown in FIG. 2D, after bonding the semiconductor substrate 100 and the cap layer 118 to the MEMS layer 108, the third recess 120 is positioned in the first region 102A and aligned with the first recess 104, in accordance with some embodiments. As shown in FIG. 2D, the first recess 104 and the third recess 120 are connected by the first through hole 114 and form a first cavity 128, in accordance with some embodiments. As shown in FIG. 2D, the polymer element 126 is positioned in the first recess 104 of the first cavity 128, in accordance with some embodiments.

Figure 2E:
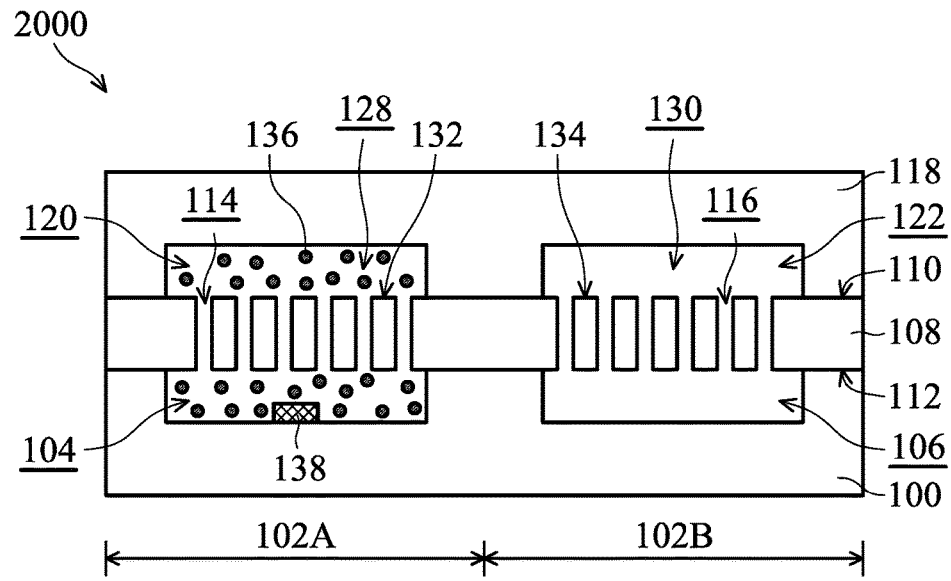

Afterwards, as shown in FIG. 2E, the polymer element 126 is degraded to form a gas 136 in the first cavity 128 and form a MEMS device structure 2000. In some embodiments, due to the gas 136 formed in the first cavity 128, the first pressure of the first cavity 128 is increased from the first pressure level to a second pressure level, in accordance with some embodiments. In some embodiments, the second pressure level is higher than the first pressure level.

Figure 3:
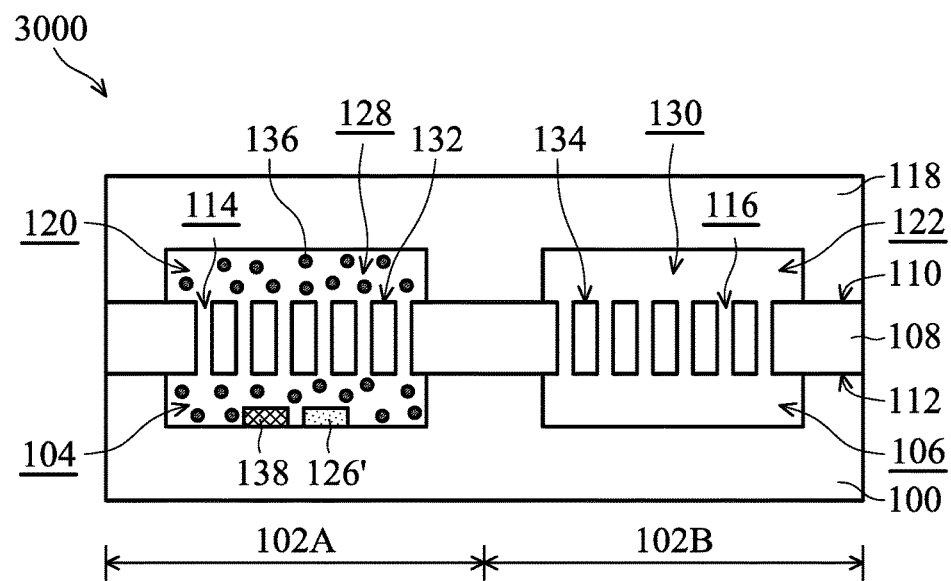
FIG. 3 is a cross-sectional view of a MEMS device structure in accordance with some embodiments.

FIG. 3 is a cross-sectional view of a MEMS device structure 3000 in accordance with some embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiment shown in FIG. 2E and the embodiment shown in FIG. 3 is that the polymer element 126 is partially degraded. As shown in FIG. 3, the degradation process of the polymer element 126 also forms a partially degraded polymer element 126' in the first cavity 128, in accordance with some embodiments. As shown in FIG. 3, the partially degraded polymer element 126' is positioned in the first recess 104 of the first cavity 128, in accordance with some embodiments.

However, the embodiments of the present disclosure are not limited thereto. In some other embodiments, the partially degraded polymer element 126' is formed in the third recess 120 of the first cavity 128, in accordance with some embodiments.

In some embodiments, the partially degraded polymer element 126' is made of a thermal sensitive polymer, a photoactive polymer, photoresist, another suitable material, or a combination thereof. In some embodiments, the thermal sensitive polymer includes fluoroelastomer, acrylonitrile butadiene rubber, polychloroprene, butyl rubber, polyurethane, silicone, perfluoroelastomer, polytetrafluoroethylene, polychlorotrifluoroethylene, polyimide, another suitable material, or a combination thereof.

Figure 4A:
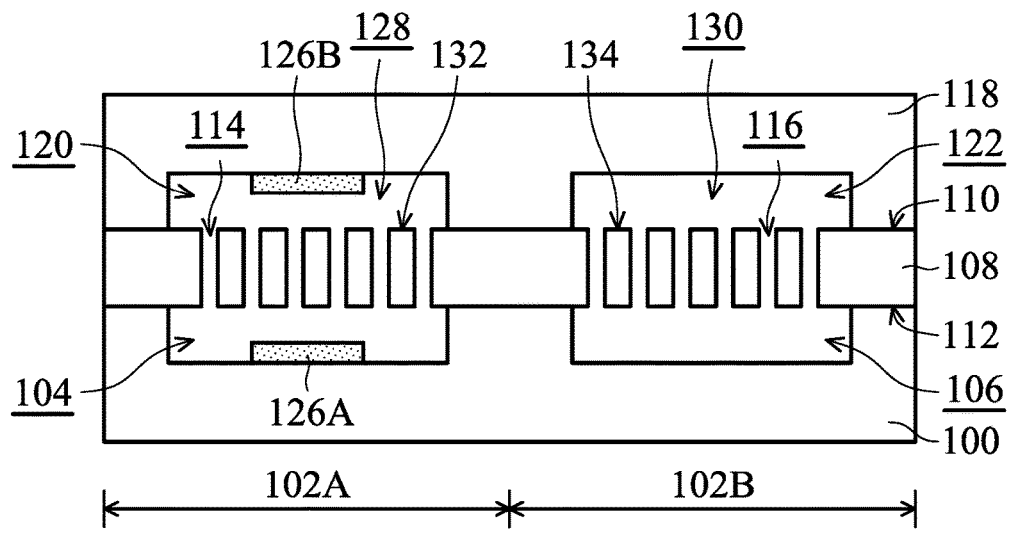
FIGS. 4A-4B are cross-sectional views of various stages of a process for forming a MEMS device structure, in accordance with some embodiments.
Figure 4B:
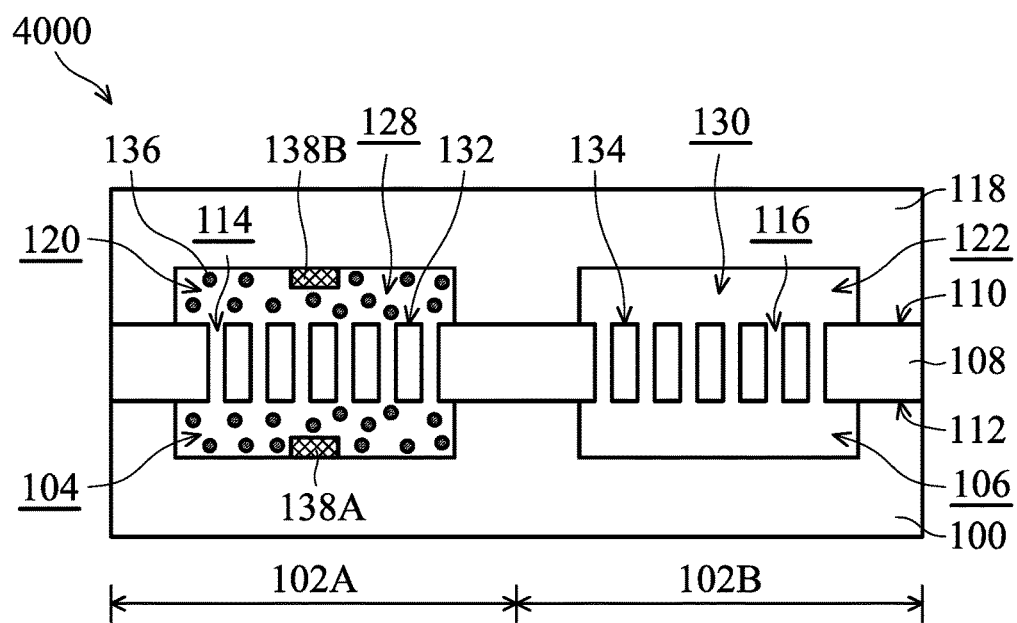

FIGS. 4A-4B are cross-sectional views of various stages of a process for forming a MEMS device structure 4000, in accordance with some embodiments. As shown in FIG. 4, a polymer element 126A is formed in the first recess 104 of the first cavity 128, in accordance with some embodiments. As shown in FIG. 4, a polymer element 126B is formed in the third recess 120 of the first cavity 128, in accordance with some embodiments.

Afterwards, as shown in FIG. 4B, the polymer element 126A and polymer element 126B are degraded to form the gas 136 in the first cavity 128 and form a MEMS device structure 4000. In some embodiments, the degradation process of the polymer element 126A forms a degradation product 138A in the first recess 104 of the first cavity 128, in accordance with some embodiments. In some embodiments, the degradation process of the polymer element 126B forms a degradation product 138B in the third recess 120 of the first cavity 128, in accordance with some embodiments.

Figure 5:
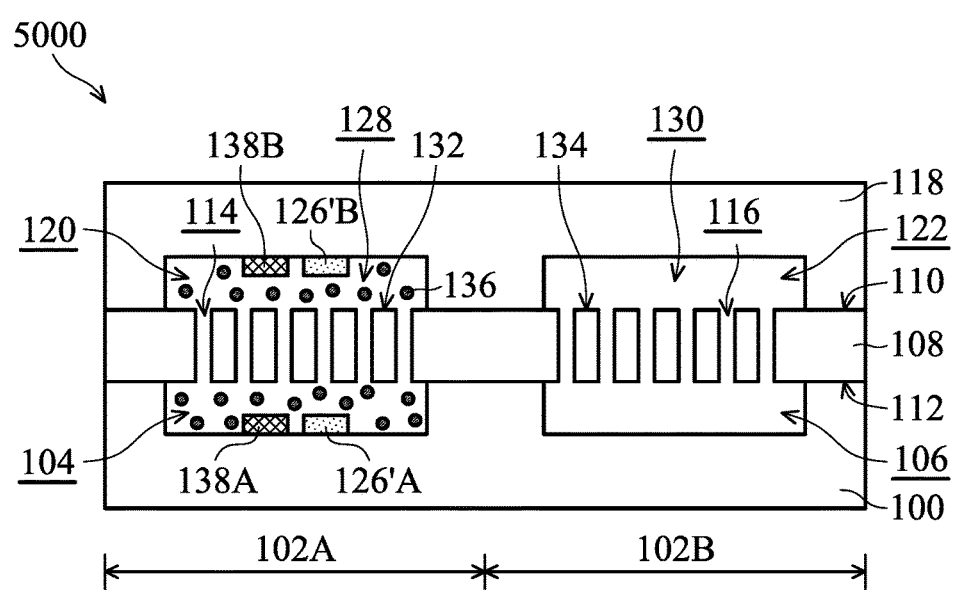
FIG. 5 is a cross-sectional view of a MEMS device structure in accordance with some embodiments.

FIG. 5 is a cross-sectional view of a MEMS device structure 5000 in accordance with some embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

The difference between the embodiment shown in FIG. 4B and the embodiment shown in FIG. 5 is that the polymer element 126 is partially degraded. As shown in FIG. 5, the degradation process of the polymer element 126A also forms a partially degraded polymer element 126'A in the first cavity 128, in accordance with some embodiments. As shown in FIG. 5, the partially degraded polymer element 126'A is positioned in the first recess 104 of the first cavity 128, in accordance with some embodiments.

As shown in FIG. 5, the degradation process of the polymer element 126B also forms a partially degraded polymer element 126'B in the first cavity 128, in accordance with some embodiments. As shown in FIG. 5, the partially degraded polymer element 126'B is positioned in the third recess 120 of the first cavity 128, in accordance with some embodiments.

Embodiments of the disclosure use polymer to produce gas in the first cavity to increase the pressure in the first cavity. In some embodiments, since the polymer can produce sufficient gas in the first cavity, the first pressure of the first cavity in some embodiments can reach the high pressure level. In some embodiments, the polymer material layer is easy to pattern. Therefore, the method in some embodiments is cost-effective. In some embodiments, the amount of gas produced is easy to control by controlling the heating temperature, heating time, exposure intensity, exposure time, the amount of polymer element, or the material of the polymer element. Therefore, in some embodiments, the first pressure of the first cavity can be accurately controlled, and the yield can be improved.

In accordance with some embodiments, a MEMS device structure is provided. The MEMS device structure includes a semiconductor substrate having a first region and a second region, and a MEMS layer over the semiconductor substrate. The MEMS layer has a first through hole positioned in the first region and a second through hole positioned in the second region. The MEMS device structure also includes a cap layer over the MEMS layer, a first cavity between the semiconductor substrate and the cap layer and in the first region, and a second cavity between the semiconductor substrate and the cap layer and in the second region. The MEMS device structure further includes a carbon-based degradation product in the first cavity.

In accordance with some embodiments, a method for forming a MEMS device structure is provided. The method includes providing a semiconductor substrate having a first region and a second region. The semiconductor substrate has a first recess in the first region and a second recess in the second region. The method also includes providing a cap layer. The cap layer has a third recess and a fourth recess. The method further includes providing a MEMS layer with a top surface and a bottom surface opposite to each other, forming a polymer element in the first recess and/or the third recess, bonding the semiconductor substrate to the bottom surface of the MEMS layer with the first recess and the second recess facing the bottom surface, and forming a first through hole and a second through hole extending from the top surface of the MEMS layer to the bottom surface of the MEMS layer. After bonding the semiconductor substrate to the MEMS layer, the first through hole is positioned in the first region, and the second through hole is positioned in the second region. The method also includes bonding the cap layer to the top surface of the MEMS layer with the third recess and the fourth recess facing the top surface. After bonding the semiconductor substrate and the cap layer to the MEMS layer, the third recess is positioned in the first region and aligned with the first recess, and the first recess and the third recess are connected by the first through hole and form a first cavity. The polymer element is in the first cavity. The fourth recess is positioned in the second region and aligned with the second recess, and the second recess and the fourth recess are connected by the second through hole and form a second cavity. The first cavity has a first pressure, and the second cavity has a second pressure. The first pressure and the second pressure are both at a first pressure level. The method further includes degrading the polymer element to form a gas in the first cavity to increase the first pressure of the first cavity from the first pressure level to a second pressure level which is higher than the first pressure level.

In accordance with some embodiments, a method for forming a MEMS device structure is provided. The method includes providing a semiconductor substrate having a first region and a second region. The semiconductor substrate has a first recess in the first region and a second recess in the second region. The method also includes providing a cap layer. The cap layer has a third recess and a fourth recess. The method further includes providing a MEMS layer with a top surface and a bottom surface opposite to each other, forming a polymer element in the first recess and/or the third recess, bonding the semiconductor substrate to the bottom surface of the MEMS layer with the first recess and the second recess facing the bottom surface, and forming a first through hole and a second through hole extending from the top surface of the MEMS layer to the bottom surface of the MEMS layer. After bonding the semiconductor substrate to the MEMS layer, the first through hole is positioned in the first region, and the second through hole is positioned in the second region. The method also includes bonding the cap layer to the top surface of the MEMS layer with the third recess and the fourth recess facing the top surface. After bonding the semiconductor substrate and the cap layer to the MEMS layer, the third recess is positioned in the first region and aligned with the first recess, and the first recess and the third recess are connected by the first through hole and form a first cavity. The polymer element is in the first cavity. The fourth recess is positioned in the second region and aligned with the second recess, and the second recess and the fourth recess are connected by the second through hole and form a second cavity. The method further includes degrading the polymer element to form a gas in the first cavity. The gas includes gaseous dihydrogen monoxide, gaseous carbon monoxide, gaseous carbon dioxide, gaseous hydrocarbon, and a first organic gas containing carbon, hydrogen and oxygen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a MEMS device structure, comprising:
   providing a semiconductor substrate having a first region and a second region, wherein the semiconductor substrate has a first recess in the first region and a second recess in the second region;
   providing a cap layer, wherein the cap layer has a third recess and a fourth recess;
   providing a MEMS layer with a top surface and a bottom surface opposite to each other;
   forming a polymer element in the first recess and/or the third recess;
   bonding the semiconductor substrate to the bottom surface of the MEMS layer with the first recess and the second recess facing the bottom surface;
   forming a first through hole and a second through hole extending from the top surface of the MEMS layer to the bottom surface of the MEMS layer, wherein after bonding the semiconductor substrate to the MEMS layer, the first through hole is positioned in the first region, and the second through hole is positioned in the second region;
   bonding the cap layer to the top surface of the MEMS layer with the third recess and the fourth recess facing the top surface,
   wherein after bonding the semiconductor substrate and the cap layer to the MEMS layer, the third recess is positioned in the first region and aligned with the first recess, wherein the first recess and the third recess are connected by the first through hole and form a first cavity, wherein the polymer element is in the first cavity, wherein the fourth recess is positioned in the second region and aligned with the second recess, wherein the second recess and the fourth recess are connected by the second through hole and form a second cavity,
   wherein the first cavity has a first pressure, and the second cavity has a second pressure, wherein the first pressure and the second pressure are both at a first pressure level; and
   degrading the polymer element to form a gas in the first cavity to increase the first pressure of the first cavity from the first pressure level to a second pressure level which is higher than the first pressure level.

2. The method as claimed in claim 1, wherein during the degradation of the polymer element, the second pressure of the second cavity remains constant.

3. The method as claimed in claim 1, wherein the degradation of the polymer element is achieved by heating the polymer element.

4. The method as claimed in claim 1, wherein the degradation of the polymer element is achieved by exposing the polymer element to light.

5. The method as claimed in claim 1, wherein the formation of the polymer element comprises:
   depositing a polymer material layer over the semiconductor substrate and/or the cap layer; and
   patterning the polymer material layer to form the polymer element which is in the first recess and/or the third recess by using a photolithography process and an etching process.

6. The method as claimed in claim 1, wherein the formation of the polymer element comprises:
   depositing a polymer material layer over the semiconductor substrate and/or the cap layer; and
   patterning the polymer material layer to form the polymer element which is in the first recess and/or the third recess by using an exposure process and a development process.

7. A method for forming a MEMS device structure, comprising:
   providing a semiconductor substrate having a first region and a second region, wherein the semiconductor substrate has a first recess in the first region and a second recess in the second region;
   providing a cap layer, wherein the cap layer has a third recess and a fourth recess;
   providing a MEMS layer with a top surface and a bottom surface opposite to each other;
   forming a polymer element in the first recess and/or the third recess;
   bonding the semiconductor substrate to the bottom surface of the MEMS layer with the first recess and the second recess facing the bottom surface;
   forming a first through hole and a second through hole extending from the top surface of the MEMS layer to the bottom surface of the MEMS layer, wherein after bonding the semiconductor substrate to the MEMS layer, the first through hole is positioned in the first region, and the second through hole is positioned in the second region;
   bonding the cap layer to the top surface of the MEMS layer with the third recess and the fourth recess facing the top surface,
   wherein after bonding the semiconductor substrate and the cap layer to the MEMS layer, the third recess is positioned in the first region and aligned with the first recess, wherein the first recess and the third recess are connected by the first through hole and form a first cavity, wherein the polymer element is in the first cavity, wherein the fourth recess is positioned in the second region and aligned with the second recess, wherein the second recess and the fourth recess are connected by the second through hole and form a second cavity; and
   degrading the polymer element to form a gas in the first cavity, wherein the gas comprises gaseous dihydrogen monoxide, gaseous carbon monoxide, gaseous carbon dioxide, gaseous hydrocarbon, and a first organic gas containing carbon, hydrogen and oxygen.

8. The method as claimed in claim 7, wherein the first organic gas is represented by CmHqOr, wherein m is an integer in a range from 1 to 30, q is an integer in a range from 4 to 62, and r is an integer in a range from 1 to 62.

9. The method as claimed in claim 7, wherein the gas further comprises a second organic gas containing carbon, hydrogen and nitrogen, wherein the second organic gas is represented by CaHbNd, wherein a is an integer in a range from 1 to 30, b is an integer in a range from 5 to 124, and d is an integer in a range from 1 to 62.

10. The method as claimed in claim 7, wherein the gas further comprises
   a third organic gas containing carbon, hydrogen and halogen, wherein the third organic gas is represented by CeHfXg, wherein e is an integer in a range from 1 to 30, f is an integer in a range from 1 to 61, and g is an integer in a range from 61 to 1, wherein X is halogen; and
   a fourth organic gas containing carbon and halogen, wherein the fourth organic gas is represented by CiXj, wherein i is an integer in a range from 1 to 30, j is an integer in a range from 4 to 62, wherein X is halogen.

11. A method for forming a MEMS device structure, comprising:
   forming a polymer material layer over a cap layer having a first recess and a second recess;
   patterning the polymer material layer to form a polymer element in the first recess of the cap layer;
   forming a MEMS layer over a semiconductor substrate, wherein the MEMS layer has a first through hole and a second through hole;
   disposing the cap layer over the MEMS layer, such that the first through hole is aligned with the first recess of the cap layer and the second through hole is aligned with the second recess of the cap layer; and
   degrading the polymer element to form a gas in the first through hole and a degradation product.

12. The method as claimed in claim 11, wherein the semiconductor substrate has a third recess and a fourth recess, the first recess and the third recess are connected by the first through hole and form a first cavity, the second recess and the fourth recess are connected by the second through hole and form a second cavity, and the first cavity and the second cavity are hermetically sealed cavities and are separated from each other.

13. The method as claimed in claim 12, wherein before degrading the polymer element, the first cavity has a first pressure, the second cavity has a second pressure, and the first pressure and the second pressure are substantially vacuums.

14. The method as claimed in claim 12, wherein after degrading the polymer element, the first cavity has a first pressure, the second cavity has a second pressure, and the first pressure is higher than the second pressure.

15. The method as claimed in claim 14, wherein the first pressure is in a range from about 30 torr to about 1000 torr, and the second pressure is substantially a vacuum.

16. The method as claimed in claim 11, wherein the degradation product comprises a solid degradation product comprising coke or ash.

17. The method as claimed in claim 11, wherein the degradation product comprises a liquid degradation product comprising tar or acetone.

18. The method as claimed in claim 11, wherein degrading the polymer element during forming the cap layer over the MEMS layer.

19. The method as claimed in claim 11, wherein degrading the polymer element after forming the cap layer over the MEMS layer.

20. The method as claimed in claim 11, wherein the gas comprises gaseous dihydrogen monoxide, gaseous carbon monoxide, gaseous carbon dioxide, gaseous hydrocarbon, and a first organic gas containing carbon, hydrogen and oxygen.

* * * * *